US010845429B2

(12) United States Patent
Aoyagi et al.

(10) Patent No.: US 10,845,429 B2
(45) Date of Patent: Nov. 24, 2020

(54) ELECTRONIC CONTROL DEVICE

(71) Applicant: Hitachi Automotive Systems, Ltd., Hitachinaka (JP)

(72) Inventors: Masaki Aoyagi, Hitachinaka (JP); Takao Fukuda, Hitachinaka (JP); Atsushi Okonogi, Hitachinaka (JP)

(73) Assignee: HITACHI AUTOMOTIVE SYSTEMS, LTD., Hitachinaka (JP)

(*) Notice: Subject to any disclaimer, the term of this patent is extended or adjusted under 35 U.S.C. 154(b) by 86 days.

(21) Appl. No.: 16/321,345

(22) PCT Filed: Jul. 7, 2017

(86) PCT No.: PCT/JP2017/024913
§ 371 (c)(1),
(2) Date: Jan. 28, 2019

(87) PCT Pub. No.: WO2018/042883
PCT Pub. Date: Mar. 8, 2018

(65) Prior Publication Data

US 2019/0178928 A1 Jun. 13, 2019

(30) Foreign Application Priority Data

Aug. 31, 2016 (JP) ................................ 2016-168733

(51) Int. Cl.
*G01R 31/04* (2006.01)
*G01R 31/66* (2020.01)
(Continued)

(52) U.S. Cl.
CPC ........... *G01R 31/66* (2020.01); *F02D 41/221* (2013.01); *G01D 5/244* (2013.01); *G01R 31/50* (2020.01)

(58) Field of Classification Search
CPC ...... G01R 31/66; G01R 31/50; G01R 19/257; G01R 31/3004; G01R 31/3181
(Continued)

(56) References Cited

U.S. PATENT DOCUMENTS

2008/0231286 A1* 9/2008 Tsunekazu ............ G01R 31/50 324/509
2011/0031812 A1* 2/2011 Morimoto ............. G01R 19/10 307/77
(Continued)

FOREIGN PATENT DOCUMENTS

CN 103983882 A 8/2014
JP H08-86824 A 4/1996
(Continued)

*Primary Examiner* — Tung X Nguyen
*Assistant Examiner* — Robert P Alejnikov, Jr.
(74) *Attorney, Agent, or Firm* — Foley & Lardner LLP

(57) ABSTRACT

Provided is an electronic control device capable of performing abnormality diagnosis of a digital input circuit without modifying the circuit configuration. Included are: an external connection terminal to which an external power supply is connected; a first capacitor having one end connected to the external connection terminal and the other end connected to circuit ground; a microcomputer having a D/I port which is an input/output port and to which a voltage of the external connection terminal is input; an RC filter provided between the D/I port and the first capacitor, the RC filter including a first resistor and a second capacitor; and a second resistor for dividing an output voltage of the D/I port together with the first resistor and applying the divided voltage to one end of the first capacitor, in which the microcomputer outputs a predetermined voltage from the D/I port and diagnoses a connection condition of the external connection terminal on the basis of a voltage input to the D/I port after the first capacitor is charged with the predetermined voltage.

7 Claims, 3 Drawing Sheets

(51) Int. Cl.
*G01D 5/244* (2006.01)
*G01R 31/50* (2020.01)
*F02D 41/22* (2006.01)

(58) Field of Classification Search
USPC ................................................ 324/538, 750.3
See application file for complete search history.

(56) References Cited

U.S. PATENT DOCUMENTS

| | | | | |
|---|---|---|---|---|
| 2013/0245869 | A1* | 9/2013 | Nishida | B60L 15/20<br>701/22 |
| 2014/0055169 | A1* | 2/2014 | Mitsuno | H03K 5/19<br>327/108 |
| 2014/0253141 | A1* | 9/2014 | Swoboda | G01R 31/2851<br>324/538 |
| 2014/0320155 | A1* | 10/2014 | Durston | G01R 31/64<br>324/750.3 |
| 2015/0039913 | A1* | 2/2015 | Sugiyama | G01R 21/006<br>713/300 |

FOREIGN PATENT DOCUMENTS

| | | | |
|---|---|---|---|
| JP | 2002-181867 | A | 6/2002 |
| JP | 2008-232978 | A | 10/2008 |
| JP | 2010-230563 | A | 10/2010 |
| JP | 2014-041064 | A | 3/2014 |
| JP | 2014-106219 | A | 6/2014 |

* cited by examiner

ELECTRONIC CONTROL DEVICE

CROSS-REFERENCE TO RELATED APPLICATIONS

This application is a National Phase of International Patent Application No. PCT/JP2017/024913 filed on Jul. 7, 2017, which claims priority to Japanese Patent Application No. 2016-168733 filed on Aug. 31, 2016. The contents of these applications are herein incorporated by reference in their entirety.

TECHNICAL FIELD

The present invention relates to an electronic control device, and in particular, to an electronic control device for performing electronic control of a vehicle.

BACKGROUND ART

In recent vehicles, electronic control devices such as an engine control unit and a control unit for an automatic transmission are mounted, and these electronic control devices control travelling of the vehicle. In such an electronic control device, input of a detection signal by a sensor, output of a driving signal for driving a load, and other operations are performed.

JP 2010-230563 A discloses an invention which enables, in a control device in which a signal from an analog signal input circuit having a thermistor is input to an A/D input port of a microcomputer, detection of a disconnection between the thermistor and the microcomputer of the control device from a voltage change at the A/D input port.

CITATION LIST

Patent Literature

PTL 1: JP 2010-230563 A

SUMMARY OF INVENTION

Technical Problem

However, in the control device described in JP 2010-230563 A, the A/D input port is required for the microcomputer of the control device, and disconnection of the analog signal input circuit can be detected in this configuration with no disclosure having been made on abnormality diagnosis of a digital input circuit that is determined by binary values.

Moreover, there is a problem that the cost is increased when the circuit configuration is modified such as adding an electronic component or a microcomputer port for performing abnormality diagnosis on a digital input circuit.

It is an object of the present invention to provide an electronic control device capable of performing abnormality diagnosis of a digital input circuit without modifying the circuit configuration.

Solution to Problem

In order to achieve the above object, the present invention includes: an external connection terminal to which an external power supply is connected; a first capacitor having one end connected to the external connection terminal and the other end connected to circuit ground; a microcomputer having a D/I port which is an input/output port and to which a voltage of the external connection terminal is input; an RC filter provided between the D/I port and the first capacitor, the RC filter including a first resistor and a second capacitor; and a second resistor for dividing an output voltage of the D/I port together with the first resistor and applying the divided voltage to one end of the first capacitor, in which the microcomputer outputs a predetermined voltage from the D/I port and diagnoses a connection condition of the external connection terminal on the basis of a voltage input to the D/I port after the first capacitor is charged with the predetermined voltage.

Advantageous Effects of Invention

According to the present invention, it is possible to provide an electronic control device capable of performing abnormality diagnosis of a digital input circuit without modifying the circuit configuration.

Problems, configurations, and effects other than those described above will be made clear from descriptions of the following embodiments.

DESCRIPTION OF EMBODIMENTS

Hereinafter, an electronic control device according to embodiments of the present invention will be described in detail with reference to the drawings.

First Embodiment

Figure 1:
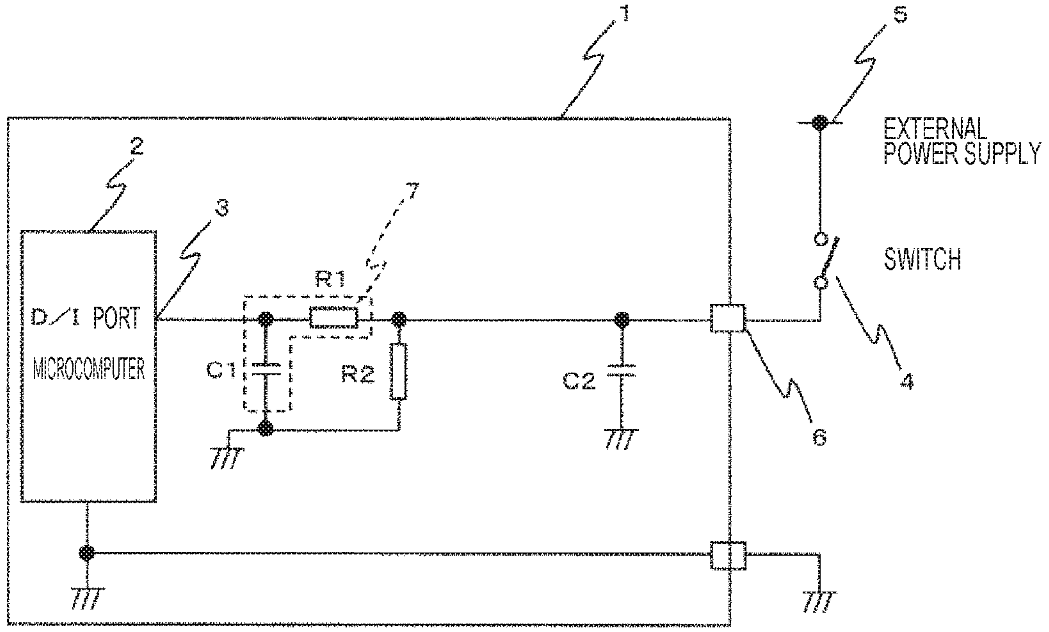
FIG. 1 is a circuit diagram illustrating a schematic configuration of an electronic control device according to a first embodiment of the present invention.

FIG. 1 is a circuit diagram illustrating a schematic configuration of an electronic control device according to a first embodiment of the present invention.

The electronic control device 1 of the first embodiment is used for electronic control of an engine, a transmission, a brake, etc. mounted on an automobile, for example, and has a microcomputer 2 for performing the electronic control. The microcomputer 2 has a CPU core (not illustrated) that operates as an operation unit of the microcomputer 2, a memory such as a RAM (not illustrated) and a ROM (not illustrated), and a peripheral circuit such as a circuit for performing external input/output.

The microcomputer 2 has a D/I port 3. The D/I port 3 is an input/output port that can be used as an input port for determining an input signal input to the D/I port 3 by binary values of HIGH and LOW and as an output port capable of outputting an output signal of HIGH or LOW from the D/I port 3. An input circuit for inputting a signal to the D/I port 3 includes, for example, an RC filter 7 including a resistor R1 and a capacitor C1, and a resistor R2 for voltage division.

As external input, for example, a voltage input of an external power supply 5 is switched by switching ON/OFF a switch 4. One end of the switch 4 is connected to the external power supply 5, and the other end of the switch 4 is connected to an external connection terminal 6 of the electronic control device 1. Since the D/I port 3 of the microcomputer 2 is input with a voltage of the external power supply 5 when the switch 4 is ON, the D/I port 3 of the microcomputer 2 determines that HIGH is input.

Furthermore, a terminal capacitor C2 for suppressing exogenous noise is connected between the external connection terminal 6 and the circuit ground (GND).

Next, a diagnosis method for circuit abnormality in the electronic control device 1 according to the first embodiment will be described.

For diagnosing abnormality, first, the D/I port 3 is changed from an input port to an output port, and a HIGH signal is output from the D/I port 3 being an output port.

Then, while the HIGH signal is being output from the D/I port 3, wait for an elapse of time (predetermined in the microcomputer 2) required for the terminal capacitor C2 to be charged, and when this time elapses, the D/I port 3 is changed from an output port to an input port. The time required for charging the terminal capacitor C2 may be predetermined on the basis of the capacity of the terminal capacitor C2.

Here, in a case where wiring from the external connection terminal 6 to the external power supply 5 is normal, the D/I port 3 is input with the voltage of the external power supply 5 with the switch 4 turned on. On the other hand, for example, in a case where there is disconnection in wiring between the terminal capacitor C2 and the external power supply 5, the D/I port 3 is input with a divided voltage and not the voltage of the external power supply 5 even when the switch 4 is ON since the terminal capacitor C2 is being charged with the voltage obtained by dividing the HIGH signal output from the D/I port 3 by the resistor R1 and the resistor R2. Moreover, for example in a case where there is a ground fault in the wiring between the external connection terminal 6 and the external power supply 5, the terminal capacitor C2 is not charged since the external connection terminal 6 has the GND potential, and the D/I port 3 is input with the GND potential and not the voltage of the external power supply 5.

Therefore, when a threshold value for determining a voltage value input to the D/I port 3 is set in software operating in the microcomputer 2, it is possible to distinguish the respective states of normal/disconnection/ground fault by determining a voltage value input to the D/I port 3 by this threshold value, thereby enabling circuit abnormality diagnosis. In other words, the microcomputer 2 is capable of diagnosing the connection state of the external connection terminal 6 on the basis of a voltage input to the D/I port 3. A value that can be used as this threshold value is a voltage value between the voltage value of the external power supply 5 (e.g. 5 V) and a voltage value obtained by dividing the HIGH signal (e.g. 5 V) output from the D/I port 3 by the resistors R1 and R2. After a HIGH signal is output from the D/I port 3 and charging time for the terminal capacitor C2 has elapsed, a voltage value input to the D/I port 3 being larger than the threshold value shows a normal state, the voltage value being smaller than the threshold value and not being the GND potential shows disconnection, and the voltage value being the GND potential shows ground fault.

Furthermore, it is possible to perform safer electronic control in the electronic control device 1 by applying an appropriate countermeasure depending on each diagnosis result such as: stopping control related to a failed part on the basis of the result of abnormality diagnosis; further including a notification device (not illustrated) for notifying a user (operator such as a driver of a vehicle) of a result of the abnormality diagnosis (for example, by sound, light, characters, an image, or vibration) and outputting the diagnosis result from the microcomputer 2 to this notification device; or for example allowing the electronic control device 1 to notify another onboard electronic control device (not illustrated) of the diagnosis result via a CAN (not illustrated).

Second Embodiment

Figure 2:
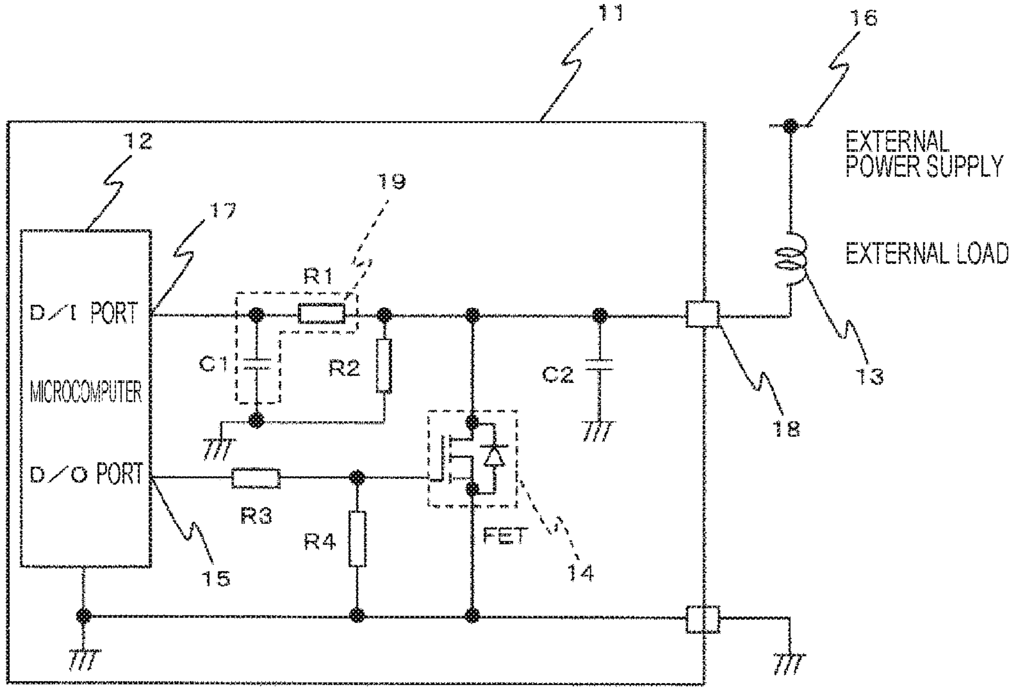
FIG. 2 is a circuit diagram illustrating a schematic configuration of an electronic control device according to a second embodiment of the present invention.

FIG. 2 is a circuit diagram illustrating a schematic configuration of an electronic control device according to a second embodiment of the present invention.

In the second embodiment, an electronic control device 11, which enables circuit abnormality diagnosis by a configuration having an FET that drives an external load, will be described as an example.

The electronic control device 1 of the second embodiment is used for electronic control of an engine, a transmission, a brake, etc. mounted on an automobile, for example, and has a microcomputer 12 for performing the electronic control. The microcomputer 12 has a CPU core (not illustrated) that operates as an operation unit of the microcomputer 12, a memory such as a RAM (not illustrated) and a ROM (not illustrated), and a peripheral circuit such as a circuit for performing external input/output.

In the second embodiment, as the electronic control device 11 for driving an external load 13, a configuration having an external load driving circuit formed by an FET 14 will be described as an example. This external load driving circuit includes the FET 14, a D/O port 15 of the microcomputer 12, a resistor R3 for protecting the D/O port 15, and a resistor R4 for confirming the LOW level. It is assumed that power is supplied to the external load 13 by an external power supply 16. One end of the external load 13 is connected to the external power supply 16, and the other end of the external load 13 is connected to an external connection terminal 18 of the electronic control device 11. Outputting a HIGH signal (e.g. a voltage of 5 V) from the D/O port 15 turns on the FET 14, and outputting a LOW signal (e.g. a voltage of 0 V) from the D/O port 15 turns off the FET 14.

The microcomputer 12 has a D/I port 17. The D/I port is an input/output port that can be used as an input port for determining an input signal input to the D/I port 17 by binary values of HIGH and LOW and as an output port capable of outputting an output signal of HIGH or LOW from the D/I port 17. An input circuit for inputting a signal to the D/I port 17 includes, for example, an RC filter 19 including a resistor R1 and a capacitor C1, and a resistor R2 for voltage division.

Furthermore, a terminal capacitor C2 for suppressing exogenous noise is connected between the external connection terminal 18 and the circuit ground (GND).

Next, a diagnosis method for circuit abnormality in the electronic control device 11 of the second embodiment will be described with reference to FIG. 3.

Figure 3:
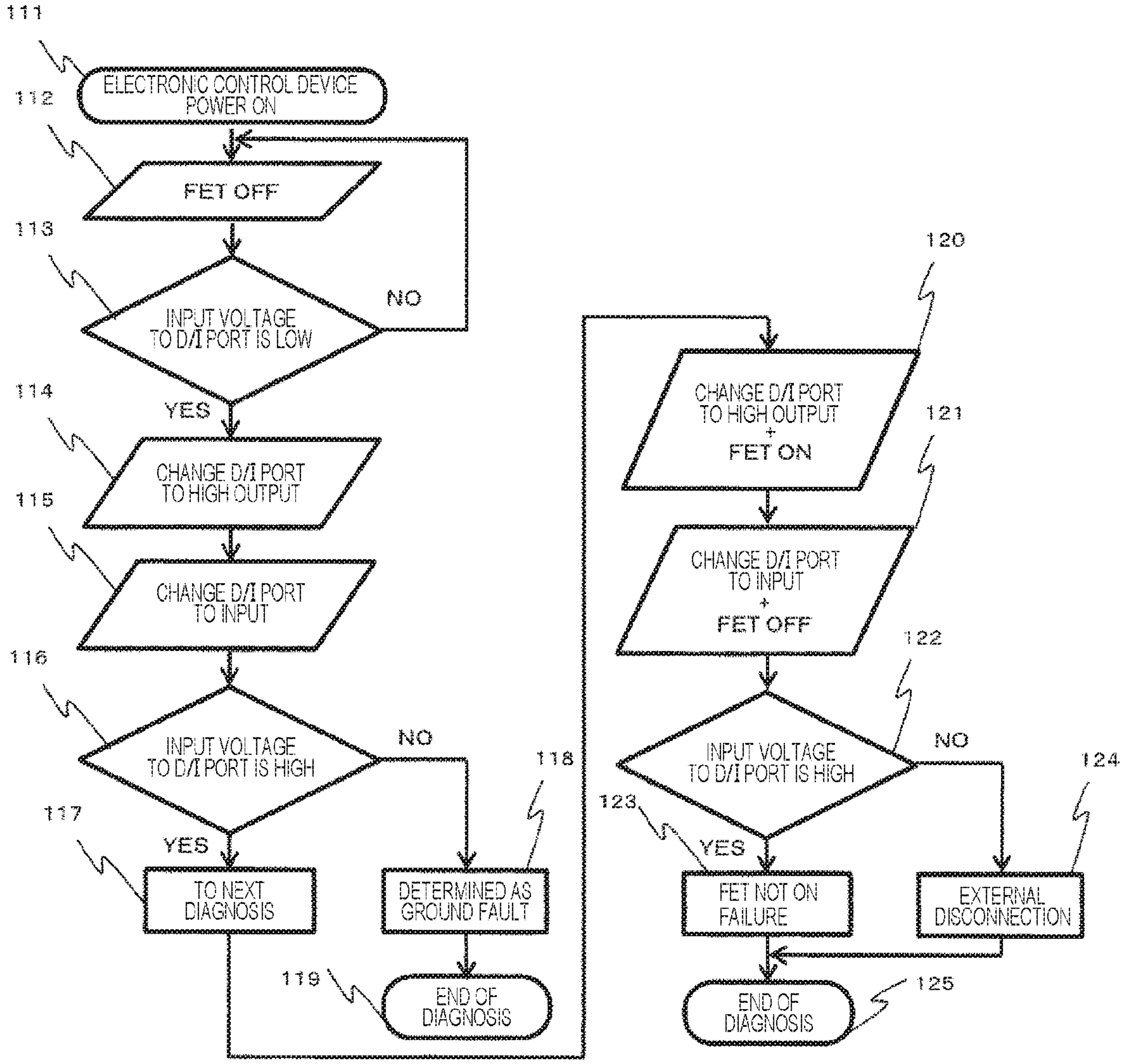
FIG. 3 is a flowchart of a diagnosis method for circuit abnormality in the electronic control device 11 according to the second embodiment of the present invention.

FIG. 3 is a flowchart of a diagnosis method for circuit abnormality in the electronic control device 11 according to the second embodiment of the present invention.

Upon abnormality diagnosis, first, the power source of the electronic control device 11 is turned on (step 111), and then the FET 14 for driving the external load is turned off (step 112). At this time, it is diagnosed whether an input voltage to the D/I port 17 of the microcomputer 12 is LOW (step 113). If not LOW, the circuit is normal, and thus the flow returns to normal control. If LOW, the voltage of the external power supply 16 is not input, which shows that an abnormality has occurred in the circuit, and thus the flow proceeds to a next step.

Next, the D/I port 17 is changed from an input port to an output port, a HIGH signal is output from the D/I port 17 being an output port (step 114), and the terminal capacitor C2 is charged by a voltage divided by the resistors R1 and R2. Here, it is waited for the time required for charging the terminal capacitor C2 that is set in advance in the microcomputer 12. The time required for charging the terminal capacitor C2 may be predetermined on the basis of the capacity of the terminal capacitor C2. Thereafter, the D/I port 17 is changed from an output port to an input port (step 115), and it is diagnosed whether an input voltage to the D/I port 17 is HIGH (step 116). If not HIGH, the terminal capacitor C2 is not charged, which shows that the external connection terminal 18 has ground fault (step 118). In this case, the diagnosis is terminated. On the other hand, if HIGH in step 116, the flow proceeds to next diagnosis (step 117).

Subsequently, the D/I port 17 is changed from an input port to an output port, and as the D/I port 17 being an output port outputs a HIGH signal, simultaneously the FET 14 is turned ON this time (step 120). Here, since the terminal capacitor C2 is charged by a voltage divided by the resistors R1 and R2, it is waited for the time required for charging the terminal capacitor C2 that is set in advance in the microcomputer 12.

Next, as the D/I port 17 is changed from an output port to an input port, simultaneously the FET 14 is turned off (step 121). Thereafter, it is diagnosed whether an input voltage to the D/I port 17 is HIGH (step 122). If HIGH (step 123), it is shown that a failure that the FET 14 is not turned on is occurring and that the terminal capacitor C2 has been charged in step 120. If not HIGH (step 124) on the other hand, the FET 14 is turned on, and the terminal capacitor C2 is not charged, which shows disconnection for example in wiring between the terminal capacitor C2 and the external power supply 16. Note that diagnosis may be performed by comparing an input voltage to the D/I port 17 with a preset threshold value. In this manner, the diagnosis is completed (step 125).

Figure 4:
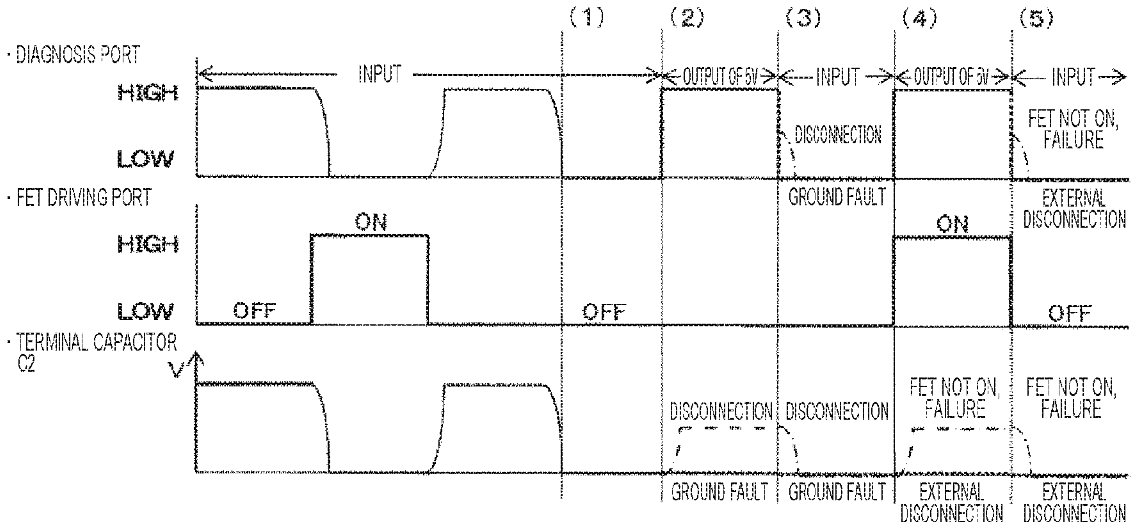
FIG. 4 is a time chart illustrating changes in voltage values at various points in the electronic control device 11 in accordance with the flow of processing illustrated in the flowchart of FIG. 3.

FIG. 4 is a time chart illustrating changes in voltage values at various points in the electronic control device 11 in accordance with the flow of processing illustrated in the flowchart of FIG. 3.

In FIG. 4, a "diagnostic port" in the upper part refers to the D/I port 17, and an "FET driving port" in the middle part refers to the D/O port 15.

A time point (1) in FIG. 4 corresponds to the time point of step 113 of FIG. 3, a time point (2) of FIG. 4 corresponds to the time point of step 114 of FIG. 3, a time point (3) of FIG. 4 corresponds to the time point of steps 115 and 116 of FIG. 3, a time point (4) of FIG. 4 corresponds to the time point of step 120 of FIG. 3, and a time point (5) of FIG. 4 corresponds to the time point of steps 121 and 122 of FIG. 3.

At (1) of FIG. 4, since the input to the D/I port 17 is LOW, the flow proceeds from step 113 to step 114 in FIG. 3.

At (2) of FIG. 4, the D/I port 17 is changed to an output port to output a HIGH signal (here, 5 V) in step 114 of FIG. 3.

A time from (2) in FIG. 4 to (3) in FIG. 4 corresponds to the time required for the terminal capacitor C2 to be charged that is set in advance in the microcomputer 12. During this time, in the case of disconnection, the terminal capacitor C2 is charged by the voltage obtained by dividing the HIGH signal output from the D/I port 17 by the resistor R1 and the resistor R2 (indicated by a dashed line for the terminal capacitor C2 in a section between (2) and (3) in FIG. 4). On the other hand in the case of a ground fault, the terminal capacitor C2 is not charged during this time.

At (3) of FIG. 4, the D/I port 17 is changed to an input port, and it is diagnosed whether an input voltage to the D/I port 17 is HIGH in steps 115 and 116 of FIG. 3. In the case where there is ground fault, the terminal capacitor C2 is not charged, and thus the input voltage to the D/I port 17 is not HIGH at (3) of FIG. 4, and the flow proceeds to step 118 in FIG. 3. Note that in the case where there is disconnection, the input voltage to the D/I port 17 is a voltage divided by the resistor R1 and the resistor R2, here however, this voltage is determined as HIGH, and the flow proceeds to step 117 of FIG. 3. Note that the processing in step 116 in FIG. 3 may be applied to a case where the voltage divided by the resistor R1 and the resistor R2 is not determined as HIGH (of course, not LOW either) instead of diagnosing whether the input voltage to the D/I port 17 is LOW by proceeding to step 118 in FIG. 3 if LOW and proceeding to step 117 in FIG. 3 if not LOW.

At (4) of FIG. 4, the D/I port 17 is changed to an output port to output a HIGH signal, and simultaneously the FET 14 is turned on in step 120 of FIG. 3. In order to turn on the FET 14, the D/O port 15 outputs a HIGH signal.

A time from (4) in FIG. 4 to (5) in FIG. 4 corresponds to the time required for the terminal capacitor C2 to be charged that is set in advance in the microcomputer 12. During this time, in the case of a failure that the FET 14 is not turned on, the terminal capacitor C2 is charged by the voltage obtained by dividing the HIGH signal output from the D/I port 17 by the resistor R1 and the resistor R2 (indicated by a dashed line for the terminal capacitor C2 in a section between (4) and (5) in FIG. 4). On the other hand in the case of disconnection, the terminal capacitor C2 is not charged during this time.

At (5) of FIG. 4, the D/I port 17 is changed to an input port, and simultaneously the FET 14 is turned off in step 121 of FIG. 3 In order to turn off the FET 14, the D/O port 15 outputs a LOW signal. Subsequently, in step 122 of FIG. 3, it is diagnosed whether an input voltage to the D/I port 17 is HIGH. In the case where there is disconnection, the terminal capacitor C2 is not charged, and thus the input voltage to the D/I port 17 is not HIGH at (5) of FIG. 4, and the flow proceeds to step 124 in FIG. 3. Note that in the case of a failure that the FET 14 is not turned on, the input voltage to the D/I port 17 is a voltage divided by the resistor R1 and the resistor R2, here however, this voltage is determined as HIGH, and the flow proceeds to step 123 of FIG. 3. Note that the processing in step 122 in FIG. 3 may be applied to a case where the voltage divided by the resistor R1 and the resistor R2 is not determined as HIGH (of course, not LOW either) instead of diagnosing whether the input voltage to the D/I port 17 is LOW by proceeding to step 124 in FIG. 3 if LOW and proceeding to step 123 in FIG. 3 if not LOW.

Therefore, executing the processing in FIG. 3 in software operating in the microcomputer 12 enables distinguishing the respective states of normal/failure in which the FET 14 is not turned on/disconnection/ground fault, thereby enabling circuit abnormality diagnosis. In other words, the microcomputer 12 is capable of diagnosing the connection state of the external connection terminal 18 on the basis of a voltage input to the D/I port 17.

Furthermore, it is possible to perform safer electronic control in the electronic control device 11 by applying an appropriate countermeasure depending on each diagnosis result such as: stopping control related to a failed part on the basis of the result of abnormality diagnosis; further including a notification device (not illustrated) for notifying a user (operator such as a driver of a vehicle) of a result of the abnormality diagnosis (for example, by sound, light, characters, an image, or vibration) and outputting the diagnosis result from the microcomputer 12 to this notification device; or for example allowing the electronic control device 11 to notify another onboard electronic control device (not illustrated) of the diagnosis result via a CAN (not illustrated).

<Note 1>

Furthermore, the present invention described above may have the following configuration in some cases.

1. (i) An electronic control device, including:
   (ii) a terminal capacitor C2 for suppressing exogenous noise;
   (iii) a microcomputer 12 having a D/I port 17 to which a voltage of an external connection terminal is input; and
   (iv) a detection circuit including an RC filter, including a resistor R1 and a capacitor C1, and a resistor R2 for voltage division for the purpose of detecting disconnection or ground fault,
   (v) in which, when the detection circuit performs abnormality diagnosis, the D/I port 17 is switched from an input state to an output state, the terminal capacitor C2 is charged by the output from the microcomputer 12, and then the D/I port 17 is switched from the output state to an input state to allow an output voltage from the terminal capacitor C2 to be monitored, and
   (vi) whether disconnection or ground fault is diagnosed on the basis of a discharge voltage from the terminal capacitor C2.

In addition, the present invention may be:
2. The electronic control device according to item 1,
   in which the electronic control device is installed to an external load driving circuit including an FET 14 for driving an external load, a microcomputer D/O port 15 for driving the FET, a resistor R3 for protecting the CPU port, and a resistor R4 for confirming an input LOW level.

In addition, the present invention may be:
3. The electronic control device according to item 2,
   in which a timing for starting the abnormality diagnosis is when the D/O port 15 outputs LOW, the FET 14 is turned off, and the D/I port 17 of the detection circuit detects LOW.

In addition, the present invention may be:
4. The electronic control device according to item 1 or 2,
   in which standby time for charging time of the terminal capacitor C2 is set on the basis of a capacity of the terminal capacitor C2.
   This enables setting charging time suitable for the terminal capacitor C2.

In addition, the present invention may be:
5. The electronic control device according to item 1 or 2,
   in which whether disconnection or ground fault is diagnosed on the basis of a comparison between a discharge voltage from the terminal capacitor C2 and a threshold value preset by software of the microcomputer.
   This allows abnormal events to be distinguished using the threshold value.

In addition, the present invention may be:
6. The electronic control device according to item 1 or 2, further including:
   a means for stopping control depending on a diagnosis result of abnormality of disconnection or ground fault or notifying a user.

<Note 2>

Furthermore, the present invention described above may have the following configuration in some cases.

1. An electronic control device including:
   an external connection terminal (e.g. external connection terminal 6, external connection terminal 18) to which an external power supply (e.g. external power supply 5, external power supply 16) is connected;
   a first capacitor (e.g. terminal capacitor C2) having one end connected to the external connection terminal and the other end connected to circuit ground;
   a microcomputer having a D/I port (e.g. D/I port 3, D/I port 17) which is an input/output port and to which a voltage of the external connection terminal is input;
   an RC filter (e.g. RC filter 7, RC filter 19) provided between the D/I port and the first capacitor, the RC filter including a first resistor (e.g. resistor R1) and a second capacitor (e.g. capacitor C1); and
   a second resistor (e.g. resistor R2) for dividing an output voltage of the D/I port together with the first resistor and applying the divided voltage to one end of the first capacitor,
   in which the microcomputer outputs a predetermined voltage from the D/I port and diagnoses a connection condition (e.g. disconnection, ground fault, normal) of the external connection terminal on the basis of a voltage input to the D/I port after the first capacitor is charged with the predetermined voltage (for example, after predetermined charging time of the first capacitor has elapsed).
   This enables provision of an electronic control device capable of performing abnormality diagnosis of a digital input circuit without changing the circuit configuration.

In addition, the present invention may be:
2. The electronic control device according to item 1, further including:
   a switching element (e.g. FET 14) for driving an external load (e.g. external load 13) provided between the external power supply and the external connection terminal,
   in which the microcomputer further includes a D/O port which is an output port for outputting a signal for turning on/off the switching element, and
   the microcomputer starts diagnosis of a connection state of the external connection terminal on the basis of a voltage input to the D/I port in a state where a signal for turning off the switching element is output from the D/O port.
   This allows diagnosis to be started at the time of abnormality by distinguishing the abnormal state from the normal state, thus preventing an increase in the load of the microcomputer by performing diagnosis even in the normal state.

In addition, the present invention may be:
3. The electronic control device according to item 2,
   in which the microcomputer outputs a predetermined voltage from the D/I port in a state where a signal for turning on the switching element is output from the D/O port and, after the first capacitor is charged by the predetermined voltage (for example, after predetermined charging time of the first capacitor has elapsed), diagnoses a connection state of the switching element and the external connection terminal on the basis of a voltage input to the D/I port in a state where a signal for turning off the switching element is output from the D/O port.

This enables distinguishing also the failure that the switching element is not turned on.

In addition, the present invention may be:

4. The electronic control device according to item 1, in which charging time of the first capacitor is time set on the basis of a capacity of the first capacitor, and the microcomputer outputs the predetermined voltage from the D/I port and, after the charging time of the first capacitor has elapsed, diagnoses a connection state of the external connection terminal on the basis of a voltage input to the D/I port.

This enables setting time that ensures the first capacitor to be charged.

In addition, the present invention may be:

5. The electronic control device according to item 1, in which the microcomputer outputs the predetermined voltage from the D/I port and, after charging time of the first capacitor has elapsed, diagnoses a connection state of the external connection terminal on the basis of a comparison between a voltage input to the D/I port and a preset threshold value.

The comparison with the threshold value allows the diagnosis to be more precise.

In addition, the present invention may be:

6. The electronic control device according to item 1, in which the microcomputer stops control when a diagnosis result of the connection state of the external connection terminal is abnormal.

This can avoid that control continues with abnormality with possible danger.

In addition, the present invention may be:

7. The electronic control device according to item 1, in which the microcomputer outputs a diagnosis result of the connection state of the external connection terminal to a notification device for notifying an operator of the diagnosis result.

The notification device can notify the operator of the diagnosis result, allowing the operator to attend it.

In addition, the present invention may be:

8. A method of diagnosing a connection state of an electronic control device, the electronic control device including:

an external connection terminal to which an external power supply is connected;

a first capacitor having one end connected to the external connection terminal and the other end connected to GND;

a microcomputer having a D/I port which is an input/output port and to which a voltage of the external connection terminal is input;

an RC filter provided between the D/I port and the first capacitor, the RC filter including a first resistor and a second capacitor; and a second resistor for dividing an output voltage of the D/I port together with the first resistor and applying the divided voltage to one end of the first capacitor, in which a predetermined voltage is output from the D/I port and diagnosis on a connection condition of the external connection terminal is performed on the basis of a voltage input to the D/I port after the first capacitor is charged with the predetermined voltage (for example, after predetermined charging time of the first capacitor has elapsed).

This enables provision of a method of diagnosing a connection state of an electronic control device capable of performing abnormality diagnosis of a digital input circuit without changing the circuit configuration.

In addition, the present invention may be:

9. The method of diagnosing a connection state of the electronic control device according to item 8, in which the electronic control device further includes a switching element for driving an external load provided between the external power supply and the external connection terminal, the microcomputer further includes a D/O port which is an output port for outputting a signal for turning on/off the switching element, the microcomputer starts diagnosis of a connection state of the external connection terminal on the basis of a voltage input to the D/I port in a state where a signal for turning off the switching element is output from the D/O port, and the microcomputer outputs the predetermined voltage from the D/I port in a state where a signal for turning on the switching element is output from the D/O port and, after the first capacitor is charged by the predetermined voltage (for example, after predetermined charging time of the first capacitor has elapsed), diagnoses a connection state of the switching element and the external connection terminal on the basis of a voltage input to the D/I port in a state where a signal for turning off the switching element is output from the D/O port.

This allows diagnosis to be started at the time of abnormality by distinguishing the abnormal state from the normal state, thus preventing an increase in the load of the microcomputer by performing diagnosis even in the normal state. * This enables distinguishing also the failure that the switching element is not turned on.

Note that the present invention is not limited to the aforementioned embodiments but may include various variations. For example, the aforementioned embodiments are described in detail in order to facilitate understanding of the present invention, and thus the present invention is not necessarily limited to include all of the configurations having been described. A part of a configuration of one of the embodiments may be replaced with a configuration of another embodiment. Also, a configuration of one of the embodiments may be added with a configuration of another embodiment. Moreover, a part of a configuration of each of the embodiments may be added with, deleted of, or replaced with another configuration.

REFERENCE SIGNS LIST

1 electronic control device
2 microcomputer
3 D/I port (input/output port)
4 switch
5 external power supply
6 external connection terminal
11 electronic control device
12 microcomputer
13 external load
14 FET
15 D/O port
16 external power supply
17 D/I port (input/output port)
18 external connection terminal

The invention claimed is:

1. An electronic control device comprising:

an external connection terminal to which an external power supply is connected;

a first capacitor having one end connected to the external connection terminal and the other end connected to circuit ground;

a microcomputer having a D/I port which is an input/output port and to which a voltage of the external connection terminal is input;

an RC filter provided between the D/I port and the first capacitor, the RC filter including a first resistor and a second capacitor; and a second resistor for dividing an output voltage of the D/I port together with the first resistor and applying the divided voltage to one end of the first capacitor, wherein the microcomputer outputs a predetermined voltage from the D/I port and diagnoses a connection condition of the external connection terminal on the basis of a voltage input to the D/I port after the first capacitor is charged with the predetermined voltage.

2. The electronic control device according to claim 1, further comprising:

a switching element for driving an external load provided between the external power supply and the external connection terminal, wherein the microcomputer further includes a D/O port which is an output port for outputting a signal for turning on/off the switching element, and the microcomputer starts diagnosis of a connection state of the external connection terminal on the basis of a voltage input to the D/I port in a state where a signal for turning off the switching element is output from the D/O port.

3. The electronic control device according to claim 2, wherein the microcomputer outputs a predetermined voltage from the D/I port in a state where a signal for turning on the switching element is output from the D/O port and, after the first capacitor is charged by the predetermined voltage, diagnoses a connection state of the switching element and the external connection terminal on the basis of a voltage input to the D/I port in a state where a signal for turning off the switching element is output from the D/O port.

4. The electronic control device according to claim 1, wherein charging time of the first capacitor is time set on the basis of a capacity of the first capacitor, and the microcomputer outputs the predetermined voltage from the D/I port and, after the charging time of the first capacitor has elapsed, diagnoses a connection state of the external connection terminal on the basis of a voltage input to the D/I port.

5. The electronic control device according to claim 1, wherein the microcomputer outputs the predetermined voltage from the D/I port and, after charging time of the first capacitor has elapsed, diagnoses a connection state of the external connection terminal on the basis of a comparison between a voltage input to the D/I port and a preset threshold value.

6. The electronic control device according to claim 1, wherein the microcomputer stops control when a diagnosis result of the connection state of the external connection terminal is abnormal.

7. The electronic control device according to claim 1, wherein the microcomputer outputs a diagnosis result of the connection state of the external connection terminal to a notification device for notifying an operator of the diagnosis result.

* * * * *